United States Patent
Nakamura et al.

(10) Patent No.: US 8,181,660 B2
(45) Date of Patent: May 22, 2012

(54) TREATMENT LIQUID PERMEATION UNIT AND TREATING APPARATUS

(75) Inventors: Akihiko Nakamura, Kawasaki (JP);
Junichi Katsuragawa, Kawasaki (JP);
Yasumasa Iwata, Kawasaki (JP)

(73) Assignee: Tokyo Ohka Kogyo Co., Ltd., Kawasaki-Shi (JP)

( * ) Notice: Subject to any disclaimer, the term of this patent is extended or adjusted under 35 U.S.C. 154(b) by 676 days.

(21) Appl. No.: 12/322,156

(22) Filed: Jan. 29, 2009

(65) Prior Publication Data

US 2009/0218050 A1  Sep. 3, 2009

(30) Foreign Application Priority Data

Feb. 29, 2008  (JP) .................................. 2008-050072

(51) Int. Cl.
*B08B 3/00* (2006.01)
*B08B 3/12* (2006.01)
*B08B 6/00* (2006.01)

(52) U.S. Cl. ....................................................... 134/184

(58) Field of Classification Search .................... 134/184
See application file for complete search history.

(56) References Cited

U.S. PATENT DOCUMENTS

| | | | |
|---|---|---|---|
| 5,511,296 A * | 4/1996 | Dias et al. | 29/25.35 |
| 5,894,452 A * | 4/1999 | Ladabaum et al. | 367/163 |
| 6,230,722 B1 | 5/2001 | Mitsumori et al. | |
| 6,492,195 B2 * | 12/2002 | Nakanishi et al. | 438/106 |
| 7,211,168 B2 | 5/2007 | Miyanari | |
| 2001/0037819 A1 | 11/2001 | Mitsumori et al. | |
| 2003/0047280 A1 | 3/2003 | Takayama et al. | |
| 2005/0145264 A1 * | 7/2005 | Sakurai et al. | 134/1.3 |
| 2005/0173064 A1 | 8/2005 | Miyanari | |
| 2006/0070641 A1 * | 4/2006 | Kim | 134/184 |
| 2007/0151674 A1 * | 7/2007 | Miyanari | 156/584 |
| 2009/0042356 A1 | 2/2009 | Takayama et al. | |
| 2009/0071504 A1 * | 3/2009 | Ahn et al. | 134/1 |
| 2009/0291516 A1 | 11/2009 | Takayama et al. | |

FOREIGN PATENT DOCUMENTS

| | | |
|---|---|---|
| JP | 06-275717 A | 9/1994 |
| JP | 10-177978 A | 6/1998 |
| JP | 2003-163338 A | 6/2003 |

* cited by examiner

*Primary Examiner* — Michael Barr
*Assistant Examiner* — Charles W Kling
(74) *Attorney, Agent, or Firm* — Edwards Wildman Palmer LLP; David G. Conlin; George N. Chaclas

(57) ABSTRACT

A treatment liquid permeation unit comprises: at least one vibration unit; and a vibration transmission unit for transmitting a vibration from the vibration unit. The vibration transmission unit is positioned between an adhesive with which a wafer is combined to a supporting plate or an adhesive adhered to a surface of the wafer and the vibration unit. A vibration from the vibration unit is transmitted via the vibration transmission unit. This promotes the treatment liquid for dissolving the adhesive to permeate the adhesive to which the treatment liquid is supplied. Therefore, the treatment liquid can more uniformly permeate the adhesive in a shorter time. This allows the treatment liquid for dissolving the adhesive to permeate the adhesive with which the wafer is combined to the supporting plate or to permeate the adhesive adhered to the surface of the wafer in a shorter time.

8 Claims, 2 Drawing Sheets

TREATMENT LIQUID PERMEATION UNIT AND TREATING APPARATUS

This Nonprovisional application claims priority under U.S.C. §119(a) on Patent Application No. 050072/2008 filed in Japan on Feb. 29, 2008, the entire contents of which are hereby incorporated by reference.

FIELD OF THE INVENTION

The present invention relates to a treatment liquid permeation unit for allowing a treatment liquid to permeate an adhesive with which a substrate is combined to a supporting plate supporting the substrate, and relates to a treating apparatus comprising the same.

BACKGROUND OF THE INVENTION

As mobile phones, digital AV devices, IC cards and the like are highly functionalized, it is more demanded that a semiconductor silicon chip (hereafter referred to as "chip") be highly integrated in a package by making a mounted chip smaller and thinner. In order to fulfill high integration of a chip in a package, it is necessary to reduce a thickness of a chip down to a range of 25 to 150 µm.

However, a semiconductor wafer (hereafter referred to as "wafer") serving as a base of a chip becomes thin by grinding. Therefore, strength of the wafer decreases. This is likely to result in a crack or a warpage in the wafer. Furthermore, it is difficult to automatically carry the wafer whose strength decreases due to its smaller thickness. Therefore, it is necessary to manually carry the wafer and it is troublesome to handle the wafer.

For this reason, a wafer support system has been developed for keeping strength of a wafer by combining a plate called "supporting plate" which is composed of glass, hard plastic or the like, to a wafer to be ground, thereby preventing a crack and a warpage in the wafer. The wafer support system can keep strength of a wafer. This makes it possible to automatically carry a semiconductor wafer having been made thinner.

A wafer and a supporting plate are combined to each other with an adhesive tape, thermoplastic resin, an adhesive or the like. Then the wafer is released from the supporting plate before the wafer is diced. The wafer is released from the supporting plate as follows: in case where an adhesive tape is used for combining the wafer to the supporting plate, the wafer is ripped off from the supporting plate; in case where thermoplastic resin is used, the resin is dissolved by applying heat to the resin; in case where an adhesive is used, the adhesive is dissolved using a dissolving liquid.

For example, Japanese Unexamined Patent Application Publication No. 135272/2006 (Tokukai 2006-135272) (Published on May 25, 2006) discloses a technique for releasing a wafer from a supporting plate by adhering the wafer to the supporting plate with the use of an adhesive and dissolving the adhesive with a dissolving liquid. In the Japanese Unexamined Patent Application Publication No. 135272/2006 (Tokukai 2006-135272), a supporting plate having a through hole penetrating in a thickness direction is used. When the wafer is released from the supporting plate, the dissolving liquid is supplied to the adhesive from the supporting plate side via the through hole.

In case where the supporting plate having the through hole is used as the supporting member of the wafer as mentioned above, the dissolving liquid is supplied to the adhesive from the supporting plate side via the through hole. Therefore, the dissolving liquid permeates from the adhesive near the through hole and the dissolution advances to the wafer side. Then the wafer is released from the supporting plate by permeation of the dissolving liquid over the whole adhesive so as to dissolve the whole adhesive.

However, it takes a long time to dissolve the whole adhesive because permeation of the dissolving liquid over the whole adhesive requires much time. Moreover, it is difficult to uniformly dissolve the adhesive. As a result, it takes a long time to release the wafer from the supporting plate. This will lead to a decrease in the production efficiency. For this reason, it is desired to develop an apparatus for allowing the dissolving liquid to uniformly permeate the adhesive, with which the wafer is combined to the supporting plate, in a short time. Furthermore, with an apparatus which allows the dissolving liquid to uniformly permeate the adhesive in a short time, it is possible to remove an adhesive remaining on a surface of the wafer in a short time after the wafer is released from the supporting plate. Therefore, it is expected that the apparatus is used also as an apparatus for cleaning a wafer.

SUMMARY OF THE INVENTION

The present invention is made in consideration of the aforementioned problems. It is an object of the present invention to provide a treatment liquid permeation unit which allows a treatment liquid for dissolving an adhesive to permeate the adhesive with which a wafer is combined to a supporting plate or to permeate an adhesive adhered to a surface of the wafer in a shorter time, and to provide a treating apparatus comprising the treatment liquid permeation unit.

A treatment liquid permeation unit according to the present invention, which allows a treatment liquid to permeate an adhesive with which a substrate is combined to a supporting plate supporting the substrate, comprises: at least one vibration unit; and a vibration transmission unit provided between the adhesive and the vibration unit so as to transmit a vibration from the vibration unit to the adhesive to which the treatment liquid is supplied.

Furthermore, the treatment liquid permeation unit according to the present invention, which supplies a treatment liquid to a material adhered to a surface of a substrate so as to remove the adhered material from the surface of the substrate, comprises: at least one vibration unit; and a vibration transmission unit provided between the adhered material and the vibration unit so as to transmit a vibration from the vibration unit to the adhered material to which the treatment liquid is supplied.

A treating apparatus according to the present invention comprises: a treatment liquid supply means for supplying a treatment liquid to an adhesive with which a substrate is combined to a supporting plate supporting the substrate; and a treatment liquid permeation unit for allowing the treatment liquid to permeate the adhesive to which the treatment liquid is supplied, the treatment liquid permeation unit comprising: at least one vibration unit; and a vibration transmission unit provided between the adhesive and the vibration unit so as to transmit a vibration from the vibration unit to the adhesive to which the treatment liquid is supplied.

Moreover, the treating apparatus according to the present invention comprises: a treatment liquid supply means for supplying a treatment liquid to a material adhered to a surface of a substrate; and a treatment liquid permeation unit for allowing the treatment liquid to permeate the adhered material to which the treatment liquid is supplied, the treatment liquid permeation unit comprising: at least one vibration unit; and a vibration transmission unit provided between the adhered material and the vibration unit so as to transmit a vibration from the vibration unit to the adhered material to which the treatment liquid is supplied.

Additional objects, features, and strengths of the present invention will be made clear by the description below. Further, the advantages of the present invention will be evident from the following explanation in reference to the drawings.

DESCRIPTION OF THE EMBODIMENTS

Treatment Liquid Permeation Unit

First Embodiment

Figure 1:
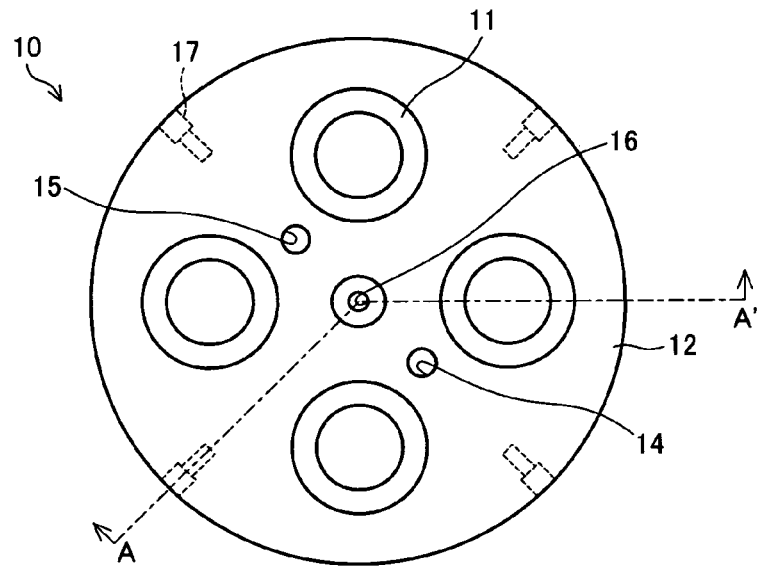
FIG. 1 is a top view of a treatment liquid permeation unit of a first embodiment.
Figure 2:
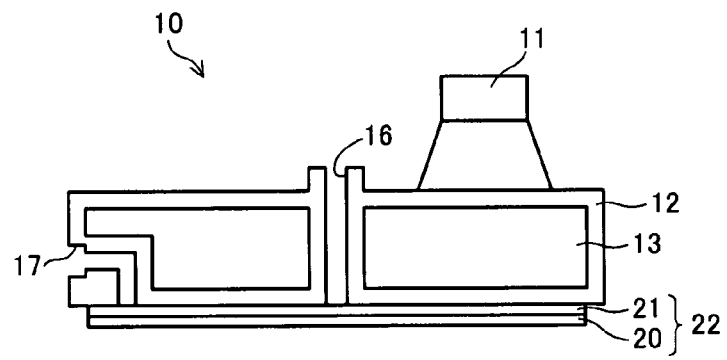
FIG. 2 is a cross-sectional view taken along a direction of A-A' line of FIG. 1.

A treatment liquid permeation unit of one embodiment of the present invention is to be described as follows, with reference to FIGS. 1 and 2. FIG. 1 is a top view of a treatment liquid permeation unit 10 of a first embodiment. FIG. 2 is a cross-sectional view taken along a direction of A-A' line of the treatment liquid permeation unit 10 of FIG. 1. As illustrated in FIGS. 1 and 2, the treatment liquid permeation unit 10 includes a vibration unit 11, a vibration transmission unit 12, a cavity portion 13, a liquid inlet (inlet) 14, a liquid outlet (outlet) 15, a dissolving liquid inlet (treatment liquid inlet) 16 and a dissolving liquid outlet (treatment liquid outlet) 17. The vibration unit 11 is provided on the vibration transmission unit 12 so as to be in contact with the vibration transmission unit 12.

Furthermore, in FIG. 2, a laminate 22 obtained by combining a wafer (substrate) 20 to a supporting plate 21 with an adhesive is provided on a side opposite to a side of the vibration unit 11 with the vibration transmission unit 12 intervening therebetween. That is, the vibration transmission unit 12 is positioned between the vibration unit 11 and the laminate 22. In the present embodiment, a supporting plate 21 having a plurality of through holes penetrating in a thickness direction is used as the aforementioned supporting plate 21. When the wafer 20 is released from the supporting plate 21 in the laminate 22, the dissolving liquid (treatment liquid) for dissolving the adhesive is supplied to the adhesive with which the wafer 20 is combined to the supporting plate 21. The treatment liquid permeation unit 10 allows the dissolving liquid to permeate the adhesive to which the dissolving liquid is supplied.

(Vibration Unit 11)

The vibration unit 11 is a vibrator or the like generating a vibration by vibrating the vibration unit 11 itself, for example. Specifically, it is preferable that a vibrator generate 20 to 100 kHz ultrasonic waves on a low frequency and 400 to 1000 kHz ultrasonic waves on a high frequency. In the present embodiment, four vibration units 11 are provided so as to face one another, but the arrangement is not limited to this. As long as at least one vibration unit 11 is provided so that a vibration will be generated on the vibration transmission unit 12, any number of vibration units 11, e.g., five or more vibration units 11 may be provided.

(Vibration Transmission Unit 12)

The vibration transmission unit 12 transmits the vibration from the vibration unit 11 to the laminate 22. The transmission unit 12 is a housing having a cavity portion 13 in its inside. The cavity portion 13 is formed in a doughnut-shaped manner with it centering on the dissolving liquid inlet 16. In the vibration transmission unit 12, the cavity portion 13 is positioned under the vibration unit 11 and filled with a liquid. By the cavity portion 13 inside the vibration transmission unit 12 being filled with the liquid, the vibration from the vibration unit 11 is propagated in the liquid. Therefore, it is possible to more extensively transmit the vibration from the vibration unit 11.

It is preferable that the vibration transmission unit 12 be made of metal which is highly efficient in transmitting a vibration, such as a stainless steal or the like, to be capable of efficiently transmitting the vibration from the vibration unit 11 toward the laminate 22. It is preferable that, in the vibration transmission unit 12, its surface on the side of the laminate 22 is substantially as large as or larger than a surface of the laminate 22 which surface faces the vibration transmission unit 12. This makes it possible to transmit the vibration from the vibration unit 11 to the laminate 22 without fail.

It is preferable to set a length in a thickness direction of the vibration transmission 12 such that an amplitude of the vibration transmitted from the transmitting unit 11 is greatest when the vibration reaches the surface of the vibration transmission unit 12 which surface is positioned on the side of the laminate 22. This makes it possible to efficiently transmit the vibration to the laminate 22. The length which maximizes the amplitude of the vibration reaching the surface of the vibration transmission unit 12 which surface is positioned on the side of the laminate 22 is determined depending on (i) a density of the liquid with which the cavity portion 13 is to be filled, (ii) a frequency of the vibration transmitted by the liquid, (iii) and the like. Moreover, it is also possible to adjust the length so that the vibration whose amplitude is most suitable for dissolving the adhesive will be transmitted to the laminate 22 by appropriately changing a volume of the liquid with which the cavity portion 13 is to be filled.

In the vibration transmission unit 12, its surface which is in contact with the vibration unit 11 is rotatable with its axis centered. Therefore, it is possible to more extensively and uniformly transmit a vibration by rotating the surface of the vibration transmission unit 12 which surface is in contact with the vibration unit 11 and moving a position of the vibration unit 11. Here the surface of the vibration transmission unit 12 which surface is in contact with the vibration unit 11 may be continuously rotated or discontinuously rotated in such a manner of temporarily suspending the rotation after rotating the surface by 90° and further rotating the surface by 90°. Furthermore, as for the timing of rotating the surface of the vibration transmission unit 12 which surface is in contact with the vibration unit 11, it is preferable that the surface be rotated after the cavity portion 13 of the vibration transmission unit 12 is filled with the liquid and the vibration unit 11 starts to vibrate.

The vibration transmission unit 12 includes the liquid inlet 14 for filling the cavity portion 13 with the liquid and the liquid outlet 15 for discharging the liquid from the cavity portion 13. In the liquid with which the cavity portion 13 is filled, bubbles may be generated by the vibration transmitted from the vibration unit 11. In such case, the liquid in the cavity portion 13 is discharged from the liquid outlet 15 and a new liquid is infused from the liquid inlet 14 because the bubbles generated in the liquid prevent transmission of the vibration.

Moreover, the vibration transmission unit 12 includes: the dissolving liquid inlet 16 for supplying the dissolving liquid to the adhesive with which wafer 20 is combined to the supporting plate 21; and the dissolving liquid outlet 17 for discharging the dissolving liquid having been supplied from the dissolving liquid inlet 16. The dissolving liquid inlet 16 penetrates the vibration transmission unit 12 from the side of the vibration unit 11 to the side of the laminate 22. The dissolving liquid outlet 17 penetrates a side surface of the vibration transmission unit 12 from the surface of the vibration transmission unit 12 which surface is positioned on the side of the laminate 22. The dissolving liquid outlet 17 is connected to a decompression means (not illustrated), such as a vacuum pump or the like. The dissolving liquid is discharged by decompressing the inside of the dissolving liquid outlet 17. Specifically, the inside of the dissolving liquid discharge hole 17 is decompressed by 10 to 30 kPa, for example.

The dissolving liquid to be supplied from the dissolving liquid inlet 16 to the adhesive is not particularly limited as long as the dissolving liquid is a liquid solvent capable of dissolving the adhesive with which the wafer 20 is combined to the supporting plate 21. A solvent for resist or a similar dissolving liquid is preferably usable. Examples thereof include alcohol, propyleneglycolmonomethylether, propyleneglycolmonomethyletheracetate, ethyllactone, and the like.

The laminate 22 is provided such that the supporting plate 21 is positioned on the side of the vibration transmission 12. The dissolving liquid supplied from the dissolving liquid inlet 16 to the laminate 22 reaches the adhesive with which the wafer 20 is combined to the supporting plate 21 via the through holes of the supporting plate 21 and the dissolving liquid permeates the adhesive. The dissolving liquid supplied from the dissolving liquid inlet 16 to the supporting plate 21 is kept, by a surface tension, between the surface of the vibration transmission unit 12 which surface is positioned on the side of the supporting plate 21 and the supporting plate 21 so as not to leak.

The liquid with which the cavity portion 13 is to be filled is not particularly limited as long as the liquid allows the vibration to propagate from the vibration unit 11. Water, a fluoric solvent, a silicon oil, or the like is preferably usable. Furthermore, the cavity portion 13 may be filled with the dissolving liquid for dissolving the adhesive. This makes it possible to supply, from the dissolving liquid inlet 16 to the adhesive, the dissolving liquid infused from the liquid inlet 14 to the cavity portion 13 and discharged from the liquid outlet 15. Therefore, a single supply line can serve as both a supply line (not illustrated) for supplying the liquid to the cavity portion 13 and a supply line (not illustrated) for supplying the dissolving liquid to the adhesive.

Moreover, it is possible to appropriately control a temperature of the liquid with which the cavity portion 13 is to be filled. Specifically, it is preferable that the temperature be set in a range of 20 to 50° C. Setting a temperature of the liquid at 50° C. or lower is suitable for prevention of the vibration unit 11 from overheating. In case where the cavity portion 13 is filled with the dissolving liquid, it is also possible to increase a solubility of the adhesive to which the dissolving liquid is supplied by setting a temperature of the dissolving liquid at 20° C. or higher.

Here as for the timing of vibrating the vibration unit 11, it is preferable that the vibration unit 11 be vibrated after the liquid is infused from the liquid inlet 14 and the cavity portion 13 of the vibration transmission 12 is filled with the liquid from the liquid inlet 14. This makes it possible to prevent the empty cavity portion 13 from being accidentally heated by a vibration before the cavity portion 13 is filled with the liquid. Furthermore, the vibration unit 11 may be vibrated after the dissolving liquid is supplied to the adhesive or may be vibrated while the dissolving liquid is being supplied to the adhesive.

The vibration is transmitted from the vibration unit 11 to the adhesive to which the dissolving liquid is supplied via the through holes of the supporting plate 21, so that the treatment liquid permeation unit 10 promotes the dissolving liquid into the adhesive. As a result, a speed of the dissolving liquid permeating the adhesive is increased. This makes it possible to dissolve the adhesive in a shorter time. Especially, in the treatment liquid permeation unit 10, the cavity portion 13 inside the vibration transmission unit 12 is filled with the liquid. Therefore, the vibration from the vibration unit 11 propagates in the liquid. In case where the vibration from the vibration unit 11 is transmitted to the laminate 22 not via the vibration transmission unit 12, the vibration is transmitted just below the vibration unit 11. Therefore, it is difficult to transmit the vibration to the whole laminate 22. According to the treatment liquid permeation unit 10, it is possible to more extensively transmit the vibration from the vibration unit 11. This thus makes it possible to more uniformly dissolve the adhesive. As a result, it is possible to shorten a time required for releasing the wafer 20 from the supporting plate 21.

Furthermore, the treatment liquid permeation unit 10 of the present invention is also preferably usable in the case of removing an adhesive remaining on or being adhered to a surface of the wafer 20 by cleaning after the supporting plate 21 is released. Specifically, by supplying the dissolving liquid to the adhesive remaining on or being adhered to the surface of the wafer 20 and transmitting the vibration from the vibration unit 11 to the adhesive via the vibration transmission 12, it is also possible to promote permeation of the dissolving liquid into the adhesive so as to dissolve the adhesive in a shorter time.

Second Embodiment

Figure 3:
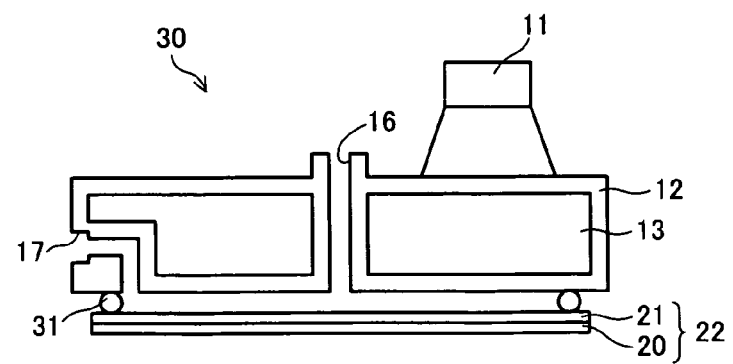
FIG. 3 is a cross-sectional view of a treatment liquid permeation unit of a second embodiment.

With reference to FIG. 3, a treatment liquid permeation unit 30 of a second embodiment is to be described. The second embodiment is different from the first embodiment in that an O ring 31 is provided between the vibration transmission 12 and the laminate 22. In the second embodiment, different points from the first embodiment are to be described.

FIG. 3 is a cross-sectional view of a treatment liquid permeation unit 30. As illustrated in FIG. 3, the treatment liquid permeation unit 30 has the O ring 31 formed to protrude in a ring shape on a rim of a surface of the vibration transmission unit 12 which surface faces the supporting plate 21. As a result, due to a surface tension, the dissolving liquid supplied from the dissolving liquid inlet 16 to the laminate 22 can be kept between the surface of the vibration transmission unit 12 which surface faces the supporting plate 21 and the supporting plate 21.

The treatment liquid permeation unit 30 of the second embodiment is advantageous in that it is possible to more securely prevent the dissolving liquid from leaking.

Third Embodiment

Figure 4:
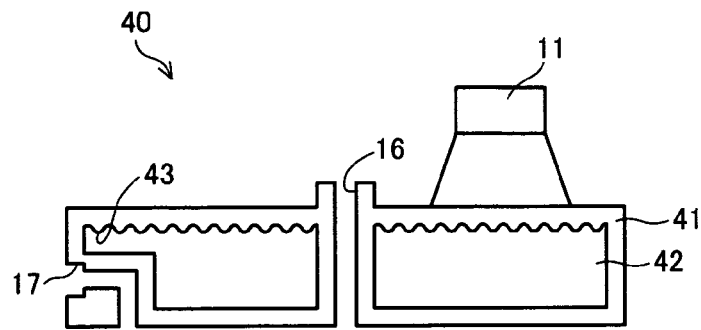
FIG. 4 is a cross-sectional view of a treatment liquid permeation unit of a third embodiment.

With reference to FIG. 4, a treatment liquid permeation unit 40 of a third embodiment is to be described. The third embodiment is different from the first embodiment in a vibration transmission unit 41. In the third embodiment, different points from the first embodiment are to be described.

FIG. 4 is a cross-sectional view of a treatment liquid permeation unit 40. As illustrated in FIG. 4, the treatment liquid permeation unit 40 is arranged so that the vibration transmission unit 41 has, inside a cavity portion 42, an uneven surface 43 on which a rough-surfaced shape is formed, formed on an internal surface on the side of the vibration unit 11. That is, the vibration transmission unit 41 has, inside the cavity portion 42, the uneven surface 43 on the opposite side of an internal surface on the side of the laminate which is to be processed. Here, inside the cavity portion 42, the internal surface on the side of the vibration unit 11 does not have to be entirely uneven as long as the internal surface is at least partially uneven.

According to the treatment liquid permeation unit 40 of the third embodiment, the vibration transmitted from the vibration unit 11 to the vibration transmission unit 41 propagates on the uneven surface 43. Moreover, the vibration is transmitted to the laminate after being propagated by the liquid with which the cavity portion 42 is filled. Therefore, it is possible to more extensively transmit the vibration from the vibration unit 11. This thus allows the dissolving liquid to more uniformly permeate the adhesive.

Fourth Embodiment

Figure 5:
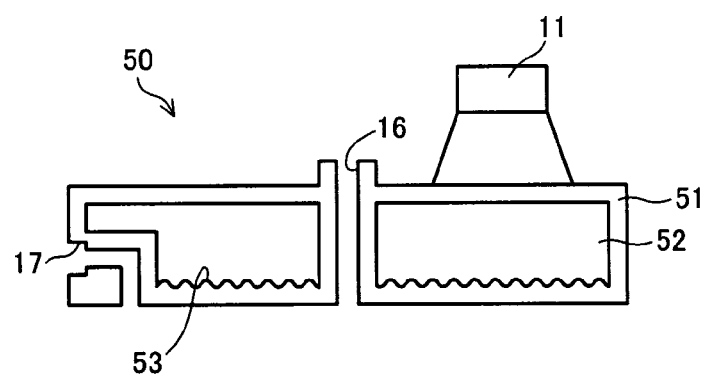
FIG. 5 is a cross-sectional view of a treatment liquid permeation unit of a fourth embodiment.

With reference to FIG. 5, a treatment liquid permeation unit 50 of a fourth embodiment is to be described. The fourth embodiment is different from the first embodiment in a vibration transmission unit 51. In the fourth embodiment, different points from the first embodiment are to be described.

FIG. 5 is a cross-sectional view of a treatment liquid permeation unit 50. As illustrated in FIG. 5, in the treatment liquid permeation unit 50, the vibration transmission unit 51 has, inside a cavity portion 52, an uneven surface 53 on which a rough-surfaced shape is formed, opposite to an internal surface on the side of the vibration unit 11. That is, the vibration transmission unit 51 has, inside the cavity portion 52, the uneven surface 53 on the side of the laminate which is to be processed. Here, inside the cavity portion 52, the internal surface opposite to the surface on the side of the vibration unit 11 does not have to be entirely uneven as long as the internal surface is at least partially uneven.

According to the treatment liquid permeation unit 50 of the fourth embodiment, the vibration transmitted from the vibration unit 11 to the vibration transmission unit 51 is propagated by the liquid with which the cavity portion 52 is filled. Moreover, the vibration is transmitted to the laminate after being propagated on the uneven surface 53. Therefore, it is possible to more extensively transmit the vibration from the vibration unit 11. This thus allows the dissolving liquid to uniformly permeate the adhesive.

Moreover, the third and fourth embodiments show the examples that, inside the cavity portion, either of an internal surface on the side of the vibration unit 11 or an internal surface opposite to the foregoing internal surface is uneven, but both of the internal surfaces may be uneven.

Fifth Embodiment

Figure 6:
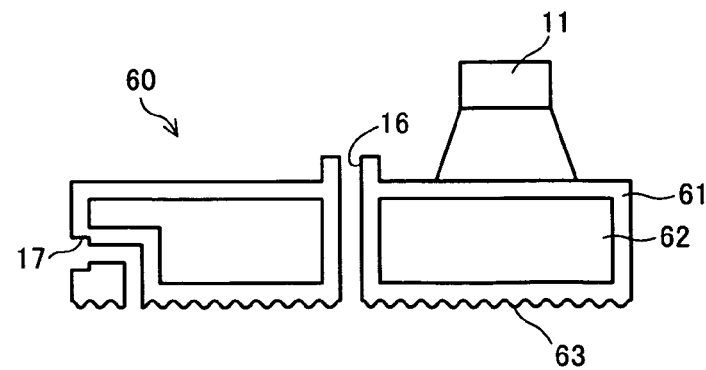
FIG. 6 is a cross-sectional view of a treatment liquid permeation unit of a fifth embodiment.

With reference to FIG. 6, a treatment liquid permeation unit 60 of a fifth embodiment is to be described. The fifth embodiment is different from the first embodiment in a vibration transmission unit 61. In the fifth embodiment, different points from the first embodiment are to be described.

FIG. 6 is a cross-sectional view of a treatment liquid permeation unit 60. As illustrated in FIG. 6, in the treatment liquid permeation unit 60, the vibration transmission unit 61 has an uneven surface 63 on which a rough-surfaced shape is formed, opposite to an external surface on the side of the vibration unit 11. That is, the vibration transmission unit 61 has the uneven surface 63 which faces the laminate which is to be processed. Here, in the vibration transmission unit 61, the external surface opposite to the external surface on the side of the vibration unit 11 does not have to be entirely uneven as long as the external surface is at least partially uneven.

According to the treatment liquid permeation unit 60 of the fifth embodiment, the vibration transmitted from the vibration unit 11 to the vibration transmission unit 61 is propagated by the liquid with which the cavity portion 62 is filled. Moreover, the vibration is transmitted to the laminate after being propagated on the uneven surface 63. Therefore, it is possible to more extensively transmit the vibration from the vibration unit 11. This thus allows the dissolving liquid to more uniformly permeate the adhesive.

[Treating Apparatus]

A treating apparatus of one embodiment of the present invention is to be described below. The treating apparatus of the present invention allows a dissolving liquid to permeate an adhesive so as to dissolve the adhesive in a laminate 22 obtained by combining a wafer 20 and a supporting plate 21 to each other via the adhesive, as illustrated in FIG. 1. Furthermore, the treating apparatus of the present invention is also usable for removing the adhesive adhered to a surface of the wafer 20 by cleaning. The treating apparatus of the present invention comprises: a treating liquid supply means (not illustrated) for supplying the dissolving liquid for dissolving the adhesive to the adhesive with which the wafer 20 and the supporting plate 21 are combined to each other; and any one of the treatment liquid permeation units described in the first to fifth embodiments.

Therefore, according to the treating apparatus of the present invention, the dissolving liquid can permeate the adhesive in a shorter time because the vibration propagated in the treatment liquid permeation unit is transmitted to a wide range of the laminate 22.

The present invention is not limited to the description of the embodiments above, but may be altered by a skilled person within the scope of the claims. An embodiment based on a proper combination of technical means disclosed in different embodiments is encompassed in the technical scope of the present invention.

A treatment liquid permeation unit of the present invention comprises: at least one vibration unit; and a vibration transmission unit provided between an adhesive and the vibration unit so as to transmit a vibration from the vibration unit to the adhesive to which a treatment liquid for dissolving the adhesive is supplied. Therefore, there is promoted permeation of the treatment liquid supplied to the adhesive with which the wafer is combined to the supporting plate or supplied to the adhesive adhered to a surface of the wafer, so that the dissolving liquid can more uniformly permeate the adhesive in a short time.

According to the treatment liquid permeation unit and the treating apparatus of the present invention, the dissolving liquid can more uniformly permeate the adhesive in a shorter time. The unit and the apparatus are thus preferably usable for producing a miniaturized semiconductor apparatus, for example.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A treatment liquid permeation unit, which allows a treatment liquid to permeate an adhesive with which a substrate is combined to a supporting plate supporting the substrate or to permeate a material adhered to a surface of the substrate, said treatment liquid permeation unit comprising:
   at least one vibration unit; and
   a vibration transmission unit provided between said adhesive or said adhered material and said vibration unit so as to transmit a vibration from said vibration unit to said adhesive or said adhered material to which the treatment liquid is supplied, wherein:
   said vibration transmission unit is filled with a liquid; and
   said liquid is the treatment liquid which permeates said adhesive or which is supplied to said adhered material.

2. The treatment liquid permeation unit as set forth in claim 1, wherein said vibration transmission unit internally has a surface which faces the adhesive or the adhered material and a surface opposite to that surface so that at least one of the surfaces is partially uneven.

3. The treatment liquid permeation unit as set forth in claim 1, wherein said vibration transmission unit has a surface which faces the adhesive or the adhered material so that the surface is partially uneven.

4. The treatment liquid permeation unit as set forth in claim 1, wherein said vibration transmission unit includes: an inlet for infusing the liquid into the vibration transmission unit; and an outlet for discharging the liquid from the vibration transmission unit.

5. The treatment liquid permeation unit as set forth in claim 1, wherein said vibration unit is movably provided on said vibration transmission unit so as to be positioned in a surface opposite to the surface which faces said adhesive or said adhered material.

6. The treatment liquid permeation unit as set forth in claim 1, further comprising: a treatment liquid supply unit, having a treatment liquid inlet for supplying the treatment liquid to said adhesive or to said adhered material; and a treatment liquid outlet for discharging the supplied treatment liquid.

7. The treatment liquid permeation unit as set forth in claim 1, further comprising a protrusion, formed on said vibration transmission unit so as to be positioned in a rim of the surface which faces said adhesive or said adhered material, for keeping a treatment liquid, which exists between the vibration transmission unit and the adhesive or between the vibration transmission unit and the adhered material, by a surface tension.

8. A treating apparatus, comprising:
   a treatment liquid supply means for supplying a treatment liquid to an adhesive with which a substrate is combined to a supporting plate supporting the substrate or to a material adhered to a surface of the substrate; and
   a treatment liquid permeation unit which allows said treatment liquid to permeate said adhesive or said adhered material to which said treatment liquid is supplied,
   said treatment liquid permeation unit comprising:
      at least one vibration unit; and
      a vibration transmission unit provided between said adhesive or said adhered material and said vibration unit so as to transmit a vibration from said vibration unit to said adhesive or said adhered material to which the treatment liquid is supplied, wherein:
   said vibration transmission unit is filled with a liquid; and
   said liquid is the treatment liquid which permeates said adhesive or which is supplied to said adhered material.

* * * * *